US009516768B2

United States Patent
Sims et al.

(10) Patent No.: US 9,516,768 B2
(45) Date of Patent: Dec. 6, 2016

(54) CONDUIT APPARATUS USABLE WITH ELECTRICAL ENCLOSURE APPARATUS

(71) Applicant: EATON CORPORATION, Cleveland, OH (US)

(72) Inventors: Daniel Garett Sims, Newberry, SC (US); Austin Parker Finley, Belton, SC (US); Michael Howard Abrahamsen, Greenwood, SC (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 15/044,011

(22) Filed: Feb. 15, 2016

(65) Prior Publication Data

US 2016/0164270 A1    Jun. 9, 2016

Related U.S. Application Data

(63) Continuation-in-part of application No. 14/087,100, filed on Nov. 22, 2013, now Pat. No. 9,263,872.

(51) Int. Cl.

| | |
|---|---|
| *F16L 5/00* | (2006.01) |
| *H05K 5/02* | (2006.01) |
| *F16L 3/12* | (2006.01) |
| *F16L 7/00* | (2006.01) |
| *F16L 3/08* | (2006.01) |
| *H02G 3/06* | (2006.01) |
| *H02B 1/56* | (2006.01) |
| *H02B 11/26* | (2006.01) |
| *H02G 3/22* | (2006.01) |
| *H02B 11/02* | (2006.01) |
| *H02G 3/03* | (2006.01) |
| *H02G 3/04* | (2006.01) |
| *H02G 3/38* | (2006.01) |
| *H02G 3/32* | (2006.01) |

(52) U.S. Cl.
CPC ............... *H05K 5/0204* (2013.01); *F16L 3/08* (2013.01); *F16L 3/12* (2013.01); *F16L 5/00* (2013.01); *F16L 7/00* (2013.01); *H02B 1/56* (2013.01); *H02B 11/26* (2013.01); *H02G 3/0616* (2013.01); *H02G 3/22* (2013.01); *H02B 11/02* (2013.01); *H02G 3/03* (2013.01); *H02G 3/0481* (2013.01); *H02G 3/32* (2013.01); *H02G 3/386* (2013.01)

(58) Field of Classification Search
CPC .......... H02G 3/0406; F16L 3/08; F16L 3/12; F16L 3/1207; F16L 5/00; F16L 7/00
USPC ................................ 248/56; 52/287.1, 288.1
See application file for complete search history.

(56) References Cited

U.S. PATENT DOCUMENTS

| | | |
|---|---|---|
| 5,931,423 A | 8/1999 | Heideloff |
| 6,357,188 B1 | 3/2002 | Lee et al. |
| 6,426,462 B1 | 7/2002 | Mignon et al. |
| 6,995,316 B1 | 2/2006 | Goto |
| 7,282,650 B2 | 10/2007 | Czuhanich et al. |
| 8,656,668 B2 | 2/2014 | Monden |
| 8,704,089 B2 | 4/2014 | Atchley |
| 2009/0218451 A1 | 9/2009 | Lundborg |
| 2010/0019106 A1 | 1/2010 | Sisley |
| 2011/0041432 A1 | 2/2011 | Colwell et al. |

*Primary Examiner* — Mark Wendell
(74) *Attorney, Agent, or Firm* — Eckert Seamans; Brij Agarwal; Philip Levy

(57) ABSTRACT

An improved conduit apparatus in accordance with the disclosed and claimed concept includes one or more conduits that each enclose therein an electrical conductor that carries a phase of a multi-phase electrical supply. The conduits are connected to the walls of the electrical enclosures with an attachment apparatus that extends between the conduits and the walls of the electrical enclosures. A clamp apparatus retains the electrical conductors in a state of tension within an interior region of the conduits in a position spaced from the walls of the conduits.

11 Claims, 9 Drawing Sheets

CONDUIT APPARATUS USABLE WITH ELECTRICAL ENCLOSURE APPARATUS

CROSS-REFERENCE TO RELATED APPLICATION

The instant application is a Continuation-In-Part application that claims priority from U.S. patent application Ser. No. 14/087,100 filed Nov. 22, 2013, the disclosures of which are incorporated herein by reference.

BACKGROUND

Field

The disclosed and claimed concept relates generally to electrical interruption equipment and, more particularly, to a conduit system for metal-clad switchgear.

Related Art

Electrical interruption equipment is generally understood. Depending upon the application, certain switchgear may be situated within metal-clad switchgear enclosures, which can also be referred to as electrical enclosures. While such electrical enclosure equipment has been generally effective for its intended purposes, it has not been without limitation.

When using metal-clad switchgear equipment, it is typically impermissible to have conductors of different voltages within the same enclosure. However, much of the control, diagnostic, monitoring, and display equipment that is provided on a metal-clad switchgear enclosure operates at 120 volts whereas the voltage of the main buses within the switchgear cabinet are at 480 volts or higher. As such, transformers are typically provided within a separate enclosure of the switchgear cabinet, with the transformers receiving relatively high voltage from the main buses and outputting power at 120 volts. As such, a need exists to transfer high voltage current from one location in a metal-clad switchgear cabinet to another part of the cabinet.

It is also understood that such metal-clad electrical cabinets often a contain a circuit interrupter such as a circuit breaker or the like. During a trip event, the gases that might be generated from an arc must be rapidly dissipated, and any conductors that may be employed to communicate the high voltage feed from the mains to the aforementioned transformers must not interfere with the dispersion of such gases. Improvements to metal-clad electrical switchgear are thus desirable.

SUMMARY

In view of the foregoing an improved conduit apparatus in accordance with the disclosed and claimed concept includes one or more conduits that each enclose therein an electrical conductor that carries a phase of a multi-phase electrical supply. The conduits are connected to the walls of the electrical enclosures with an attachment apparatus that extends between the conduits and the walls of the electrical enclosures. A clamp apparatus retains the electrical conductors in a state of tension within an interior region of the conduits in a position spaced from the walls of the conduits.

Accordingly, an aspect of the disclosed and claimed concept is to provide an improved conduit apparatus that is usable to carry electrical conductors from one location of a metal-clad electrical enclosure apparatus to another location thereof.

Another aspect of the disclosed and claimed concept is to provide an improved electrical enclosure apparatus that includes an electrical enclosure and the aforementioned conduit apparatus.

Accordingly, an aspect of the disclosed and claimed concept is to provide an improved conduit apparatus that is structured to carry therein a number of electrical conductors between a first location and a second location. The conduit apparatus can be generally stated as including a number of conduits, each conduit of the number of conduits being elongated and having a wall and an interior region situated adjacent the wall, the interior region being structured to carry therein an electrical conductor of the number of electrical conductors, a clamp apparatus comprising a number of clamps that are insulative and that are mounted to the number of conduits, the number of clamps being structured to be engageable with the number of electrical conductors and to support each electrical conductor of the number of electrical conductors within the interior region of a conduit of the number of conduits at a position spaced from the wall, and an attachment apparatus that is structured to mechanically connect the number of conduits with at least a first electrical enclosure through which at least a portion of the number of electrical conductors extend.

Another aspect of the disclosed and claimed concept is to provide an improved conduit apparatus structured to carry therein a number of electrical conductors between a first location and a second location. The conduit apparatus can be generally stated as including a number of first conduits, each first conduit of the number of first conduits being elongated and having a first wall and a first interior region situated adjacent the first wall, a number of second conduits, each second conduit of the number of second conduits being elongated and having a second wall and a second interior region situated adjacent the second wall, the second interior region being structured to carry therein an electrical conductor of the number of electrical conductors, an attachment apparatus that is structured to mechanically connect the number of first conduits with at least a first electrical enclosure through which at least a portion of the number of electrical conductors extend, and a number of supports, each support carrying thereon a corresponding second conduit of the number of second conduits and retaining the corresponding second conduit in a position situated within the first interior region of a corresponding first conduit of the number of first conduits, each support being mounted to at least one of the at least first electrical enclosure and the corresponding first conduit.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

Figure 1:
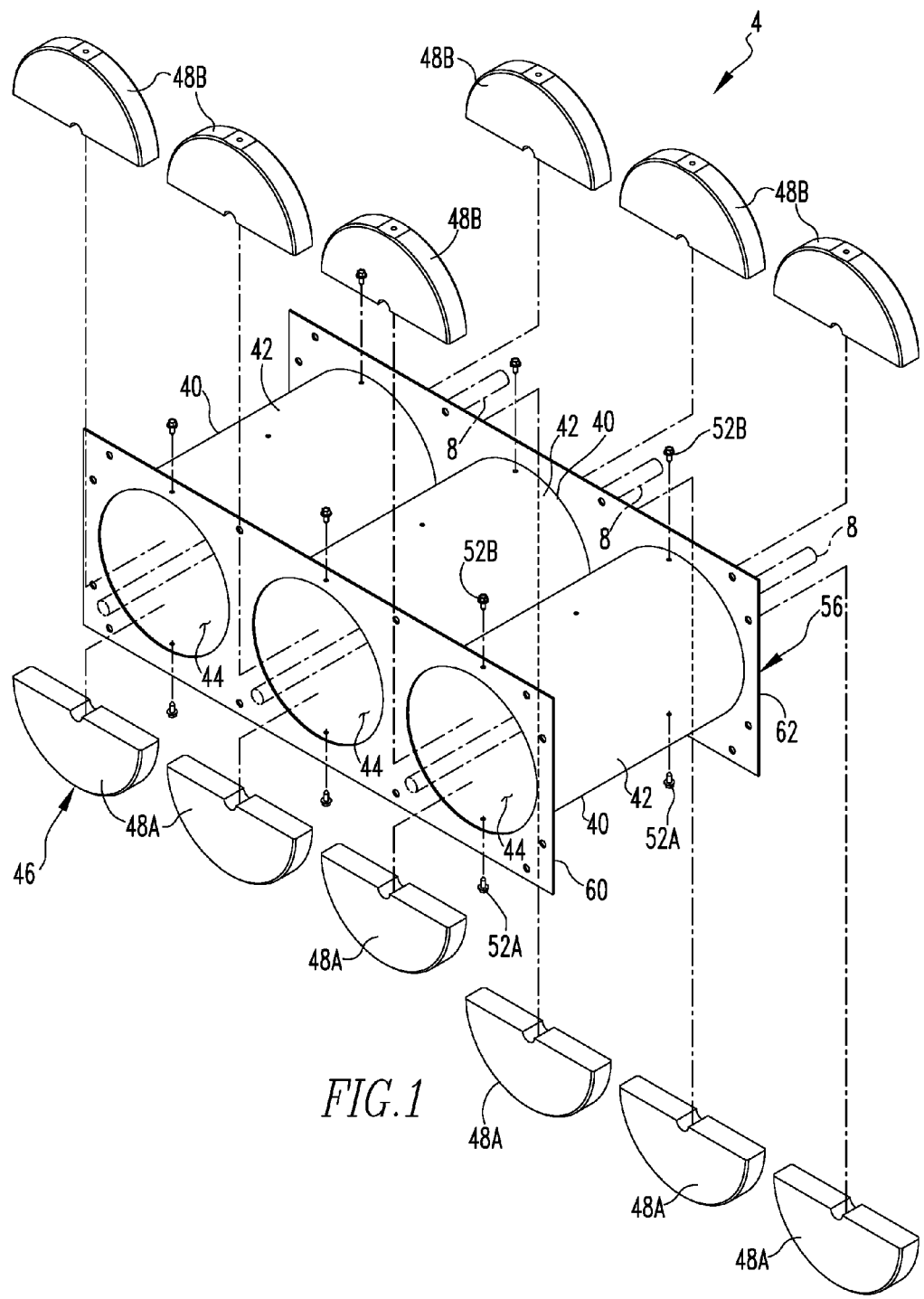
FIG. 1 is an exploded perspective view of an improved conduit apparatus in accordance with a first embodiment of the disclosed and claimed concept.

An improved conduit apparatus 4 in accordance with a first embodiment of the disclosed and claimed concept is depicted, in whole or in part, in FIGS. 1-4. The conduit apparatus 4 is employable to enclose a number of electrical conductors 8 that extend between different locations in an electrical enclosure apparatus 12 in accordance with the disclosed and claimed concept that is depicted generally in FIG. 2. As employed herein, the expression "a number of" and variations thereof shall refer broadly to any non-zero quantity, including a quantity of one.

The electrical enclosure apparatus 12 is a metal-clad switchgear cabinet and includes a plurality of electrical enclosures 16A, 16B, 16C, 16D, and 16E which may be referred to collectively or individually with the numeral 16, that are separated from one another by one of more sidewalls. For instance, the electrical enclosure 16A is a transformer enclosure that includes one or more electrical transformers situated therein, and it is separated from electrical enclosure 16C with a sidewall 20A. Likewise, the electrical enclosure 16B is a main bus compartment having a set of mains 28 that provide relatively high voltage power to a circuit interrupter 32 that is situated in the electrical enclosure 16D. A sidewall 20B separates the electrical enclosure 16B from both the electrical enclosure 16C and the electrical enclosure 16D. The electrical enclosure apparatus 12 includes a set of load side terminals 36 that are situated in the separate electrical enclosure 16E.

Figure 2:
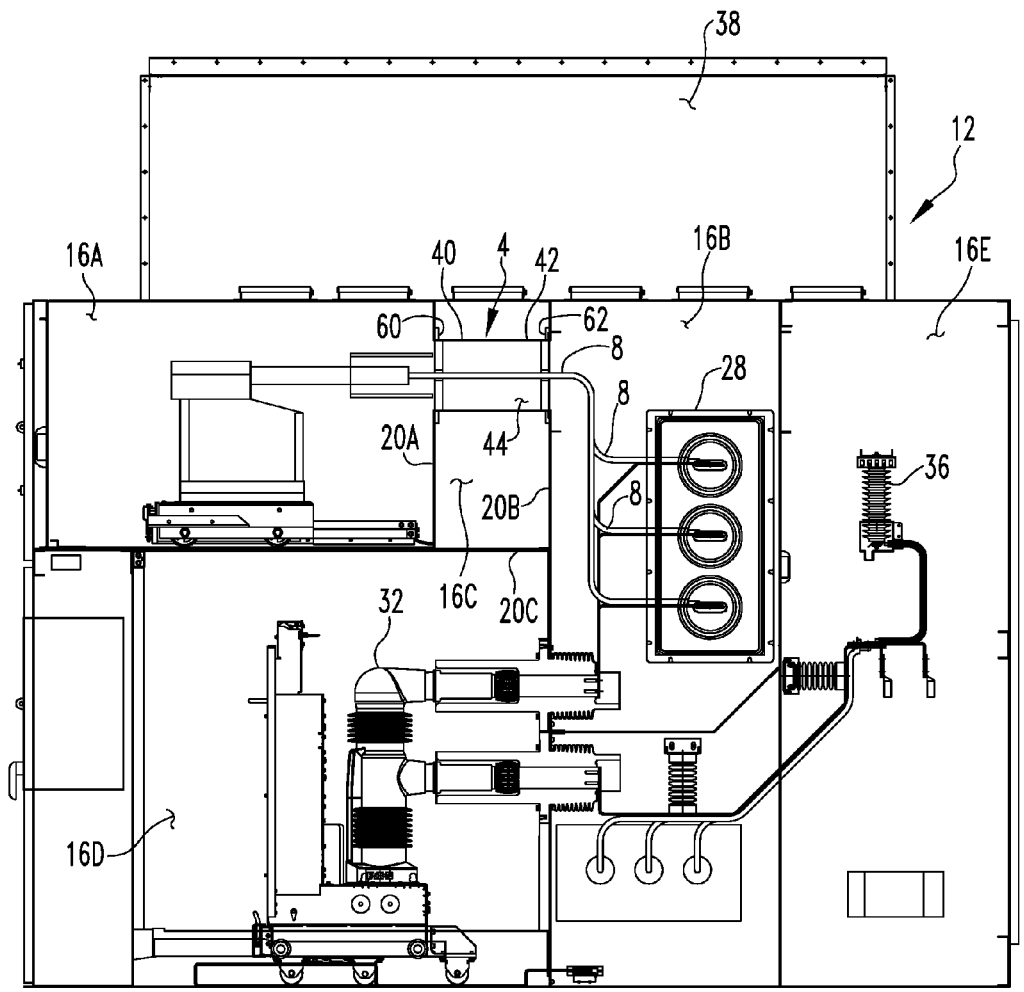
FIG. 2 is a schematic depiction of an electrical enclosure apparatus in accordance with the disclosed and claimed concept that employs the conduit apparatus of FIG. 1.

As can be understood from FIG. 2, the conduit apparatus 4 is mountable to the sidewalls 20A and 20B in order to permit a set of electrical conductors 8 to extend between the electrical enclosure 16B and the electrical enclosure 16A. Another sidewall 20C can be said to extend between the electrical enclosures 16C and 16D, it being noted that the sidewall 20C typically includes vent holes or other openings (not expressly depicted herein) through which the gases that are formed as a result of an arc event of the circuit interrupter 32 can be vented through the electrical enclosure 16 and out of a plenum 38 through which the gases are exhausted to the atmosphere. Such vent holes or other openings are also useful during normal operating conditions to provide venting that is beneficial to facilitate natural convection cooling in order to achieve necessary thermal performance required by regulatory standards.

As can be understood from FIG. 1, the conduit apparatus 4 can be said to include a plurality of conduits 40 each of which has an annular and elongated wall 42 within which is situated an interior region 44 that is disposed adjacent the wall 42. The conduit apparatus 4 further includes a clamp apparatus 46 that is situated on the plurality of conduits 40 and that carries the electric enclosures 80 through the conduits 40 by applying forces to the electrical conductors 8 to cause the electrical conductors 8 to be in a state of tension when extending through the interior region 44 of each conduit 40. The clamp apparatus 46 includes a plurality of clamps, each of which is in the exemplary form of a pairs of blocks 48A and 48B that are of a semi-circular shape and that are configured to compress the electrical conductors 8 therebetween with the use a pair of threaded elements 52A and 52B that serve as compression elements and that cooperate with the wall 42 and which are, in the depicted exemplary embodiment, threaded bolts.

The conduit apparatus 4 further includes an attachment apparatus 6 that extends from the conduits 40 and that operable to attach the conduits 40 to the sidewalls 20A and 20B of the electrical enclosure apparatus 12. In the depicted exemplary embodiment, the attachment apparatus includes an attachment flange 60 that is connectable with the sidewall 20A and another attachment flange 62 that is attachable to the sidewall 20B. The attachment flanges 60 and 62 are attachable to the sidewalls 20A and 20B through use of bolts or other fasteners, although other attachment methodologies may be employed without departing from the present concept. The attachment flanges 60 and 62 are each common to the conduits 40 and are connected therewith at the opposite ends thereof.

As can be understood from FIGS. 1 and 3, in order to cause the electrical conductors 8 to be carried in the conduits 40, one of the electrical conductors 8 is received within the interior region 44 of one of the conduits 40 and a pair of blocks 48A and 48B are received within the interior region 44 at each end of the conduit 40, with the blocks 48A and 48B being situated, for instance, above and below, respectively, the electrical conductor 8. In this regard, it can be seen that blocks 48A and 48B each include an indentation 64A and 64B, respectively. The indentation 64A and 64B confront one another and retain the electrical conductor 8 therebetween when the conduit apparatus 4 is in an assembled state, such as is depicted in part in FIG. 3.

Figure 4:
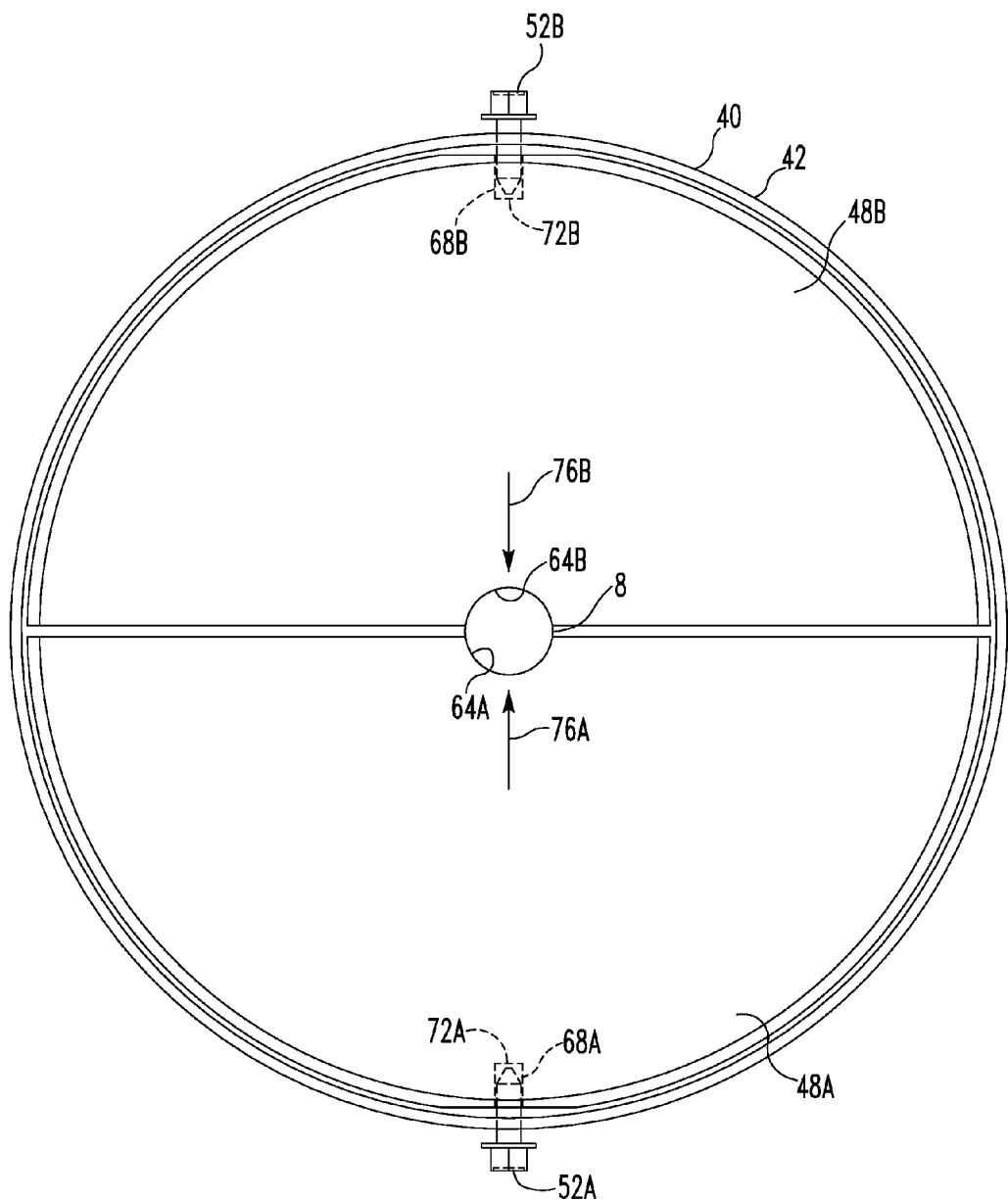
FIG. 4 is an end view of a portion of the conduit apparatus of FIG. 1.

As can be understood from FIG. 4, the blocks 48A and 48B each have a blind hole 68A and 68B, respectively, formed therein with the blind holes 68A and 68B each terminating at a base 72A and 72B, respectively. The conduit 40 includes a pair of threaded holes 74A and 74B formed at each end thereof that threadably receive therein the threaded elements 52A and 52B, respectively. When the threaded elements 52A and 52B are threadably advanced through the threaded holes 74A and 74B, the ends of the threaded elements 52A and 52B are received in the indentations 64A and 64B and become engaged against the blind holes 68A and 68B. Further tightening of the threaded elements 52A and 52B will cause a pair of confronting compression forces 76A and 76B to be applied from the threaded elements 52A and 52B to the blocks 48A and 48B and thus, in turn, to the electrical conductor 8 that is situated within the indentations 64A and 64B. Prior to such tightening, the electrical conductor 8 should be pulled tight to have a predetermined level of tension therein, after which the threaded elements 52A and 52B at both ends of the conduit 40 are tightened to apply a compressive load to the electrical conductor 8. Such compressive load resists movement of the electrical conductor 8 with respect to the blocks 48A and 48B, thereby retaining the electrical conductor 8 in its state of tension within the interior region 44.

Figure 3:
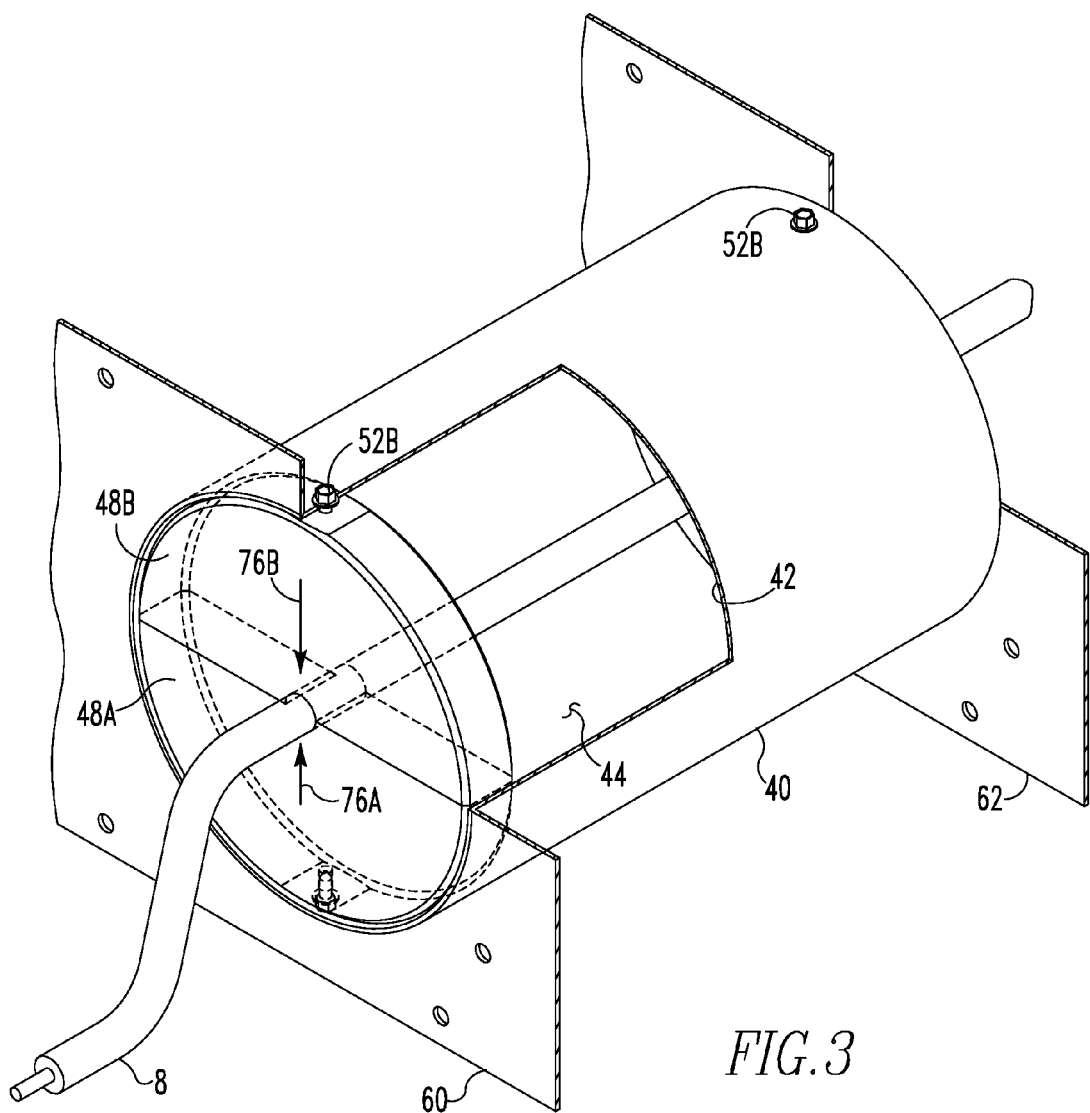
FIG. 3 is a perspective view of a portion of the conduit apparatus of FIG. 1, partially cut away.

In this regard, it can be seen from FIG. 3 that the electrical conductor 8 is carried by the pairs of blocks 48A and 48B in a position spaced from the wall 42 at a location generally axially centrally within the interior region 44. The width of the conduits 40 is desirably selected in order to resist a concentration of an electric field at the ends thereof to thereby preferably avoid voltage flash-over between the wall 42 and the electrical conductor 8. Furthermore, the pairs of blocks 48A and 48B are desirably formed of a high dielectric material that is thus of an insulative quality.

The fastening of the attachment flanges 60 and 62 to the sidewalls 20A and 20B, respectively, and the tightening of the threaded elements 52A and 52B at the ends of each conduit 40 can be done in whatever order is appropriate to the given application.

It thus can be seen that the conduit apparatus 4 separately carries each phase of a multi-phase electrical system through the interior regions 44 of a plurality of conduits 40 that are spaced apart from one another. The spacing of the conduits 40 from one another permits any exhaust gases that may flow through the sidewall 20C as a result of an arc event to flow through the spaces between adjacent conduits 40. Such gas flow thus is not impeded by the conduit apparatus 4. Rather, the hot gases that may exit through the sidewall 20C are desirably cooled when flowing past the metallic conduits 40 which are typically of a much lower temperature than the gases that would be generated by an arc event. The conduit apparatus 4 thus not only permits the free flow of exhaust gases therepast, it cools the gases in a desirable fashion prior to the exiting of the gases through the plenum 38. Also, the venting of heated air generated within the electrical enclosure apparatus 12 during normal operating conditions is beneficial to facilitate natural convection cooling in order to achieve necessary thermal performance required by regulatory standards.

Figure 5:
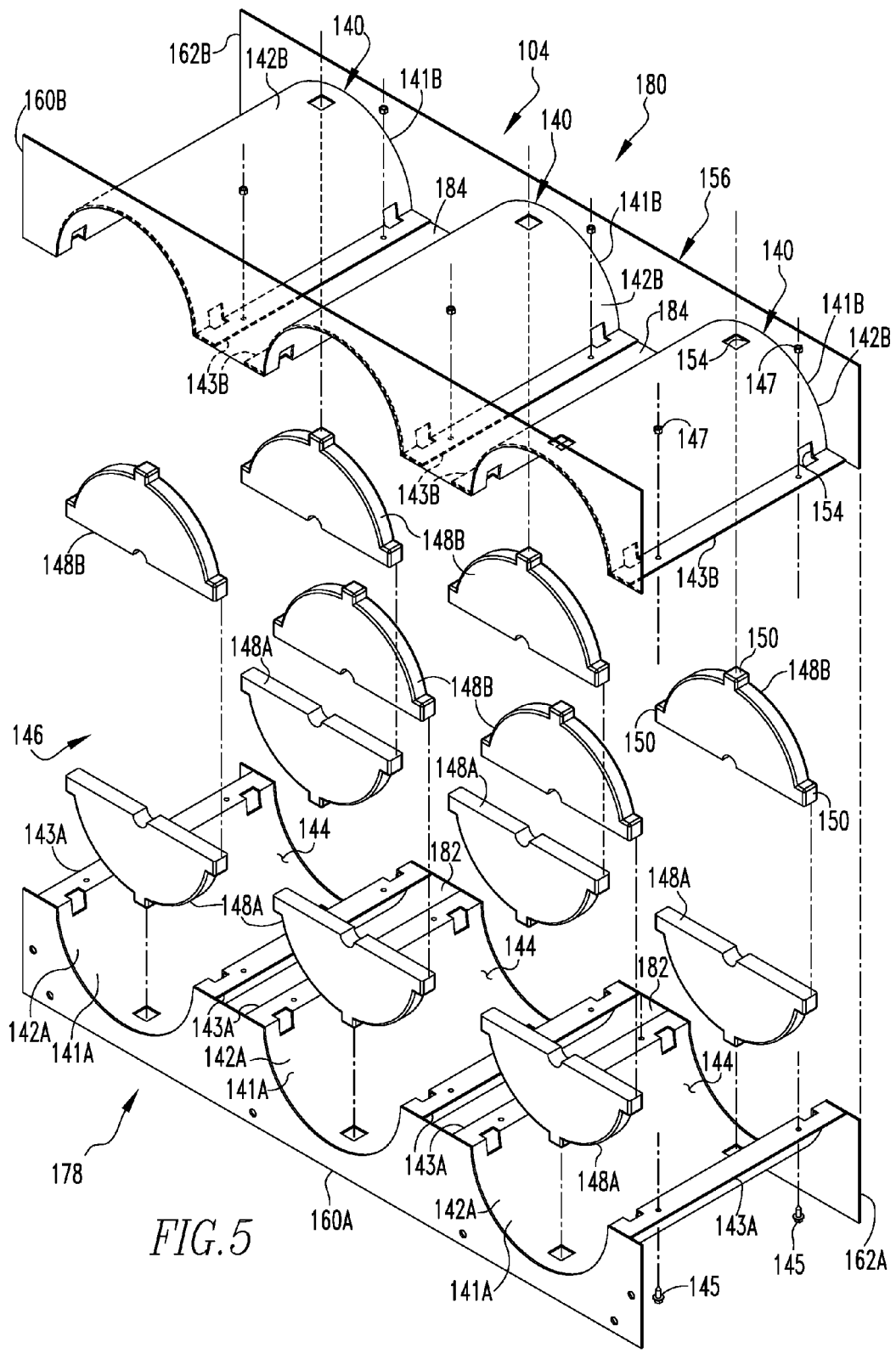
FIG. 5 is an exploded perspective view of another conduit apparatus in accordance with a second embodiment of the disclosed and claimed concept.
Figure 6:
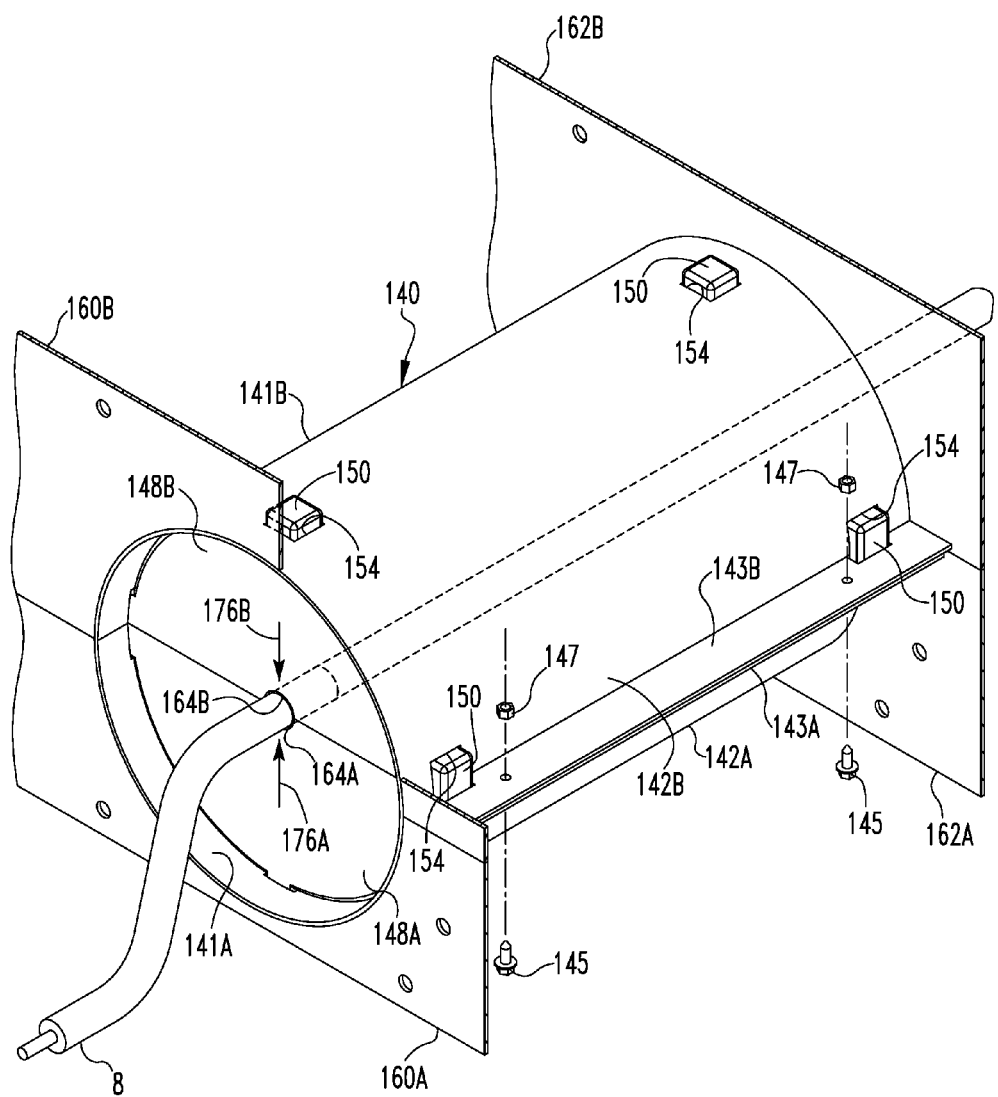
FIG. 6 is a perspective, partially cut away, of the conduit apparatus of FIG. 5.

An improved conduit apparatus 104 in accordance with a second embodiment of the disclosed and claimed concept is depicted generally in FIG. 5 and is depicted in part in FIG. 6. The conduit apparatus 104 includes a plurality of conduits 140, each of which can be said to include a pair of conduit portions 141A and 141B that are connectable together. The conduits 140 are configured to receive therein a set of electrical conductors such as the electrical conductors 8 although it is noted that the electrical conductors are not depicted in FIG. 5 for reasons of simplicity of disclosure. The conduit portions 141A and 141B each include a portion of a wall 142A and 142B, respectively, and further include a set of connection lugs 143A and 143B, respectively, at the sides of the portions of the wall 142A and 142B. The connection lugs 143A are connectable with the connection lugs 143B through the use of fasteners such as a set of bolts 145 and a set of nuts 147 that are receivable through holes formed in the connection lugs 143A and 143B. When the conduit portions 141A and 141B are connected together with the bolts and nuts 145 and 147, the concave aspects of the portions of the wall 142A and 142B face one another and interpose therebetween the interior region 144.

The conduit apparatus 104 further includes a clamp apparatus 146 that includes a plurality of pairs of blocks 148A and 148B. The blocks 148A and 148B can be said to each comprise a support portion that is similar to the blocks 48A and 48B, and the blocks 148A and 148B can be said to each further comprise include one or more legs 150 that are situated on the support portion receivable in correspondingly positioned receptacles 154 that are formed in the conduit portions 141A and 141B.

The conduit apparatus 104 further includes an attachment apparatus 156 that includes a pair of attachment flange portions 160A and 160B that are attachable to the sidewall 20A of the electrical enclosure apparatus 12. The attachment apparatus further includes a pair of attachment flange portions 162A and 162B that are attachable to the sidewall 20B of the electrical enclosure apparatus 12.

When an electrical conductor is received between the indentations 164A and 164B of the blocks 148A and 148B, and the connection lugs 143A are connected with the connection lugs 143B with a compressive force applied thereto by the cooperating bolts and nuts 145 and 157, the conduit portions 141A and 141B communicate the compressive force to the blocks 148A and 148B that in turn apply a pair of confronting compressive forces 176A and 176B that compressively retain therebetween the electrical conductor. In such a position, the support portions of the blocks 148A and 148B can be said to be situated within the interior region 144. The electrical conductor 8 is desirably placed in a state of tension when extending through the interior region 144, and the tightening of the bolts and nuts 145 and 147 applies the compressive forces 176A and 176B to the electrical conductor 8, which desirably retains the electrical conductor in a state of tension within the interior region 144. This is generally depicted in FIG. 6.

By configuring the conduit apparatus 104 such that the conduits 140 are separated into a pair of conduit portions 141A and 141B, with the conduit portions 141A connected with the attachment flange portions 160A and 162A at the opposite ends thereof to form a first assembly 178, and by similarly configuring the conduit portions 141B with the attachment flange portions 160B and 162B at the opposite ends thereof to form a second assembly 180, the conduit apparatus 104 can be installed on the electrical enclosure apparatus 12 in two steps. For example, the first assembly 178 can be mounted to the sidewalls 20A and 20B of the electrical enclosure apparatus 12 and the blocks 148B received in the receptacles 154. The electrical conductors can then be received in the indentations 164B and the blocks 148A can be received atop the electrical conductors. The second assembly 180 can then be received atop the blocks 148A with the legs 150 thereof being received in the receptacles 154 and with the attachment flange portions 160A and 162A being attached to the sidewalls 20A and 20B. The electrical conductors can then be placed in a state of tension and the bolts and nuts 145 and 147 tightened to connect together the connection lugs 143A and 143B to retain such state of tension. Other installation methodologies will be apparent.

It is noted that the first assembly 178 has open spaces 182 interposed between the adjacent connection lugs 143A, and the second assembly 180 likewise has open spaces 184 interposed between the adjacent connection lugs 143B. The open spaces 182 are aligned with the open spaces 184 when the conduit apparatus 104 is assembled. The open spaces 182 and 184 advantageously permit the passage of arc gases therethrough. Such open spaces 182 and 184 also facilitate the venting of heated air generated within the electrical enclosure apparatus 12 during normal operating conditions, which is beneficial to facilitate natural convection cooling in order to achieve necessary thermal performance required by regulatory standards.

Figure 7:
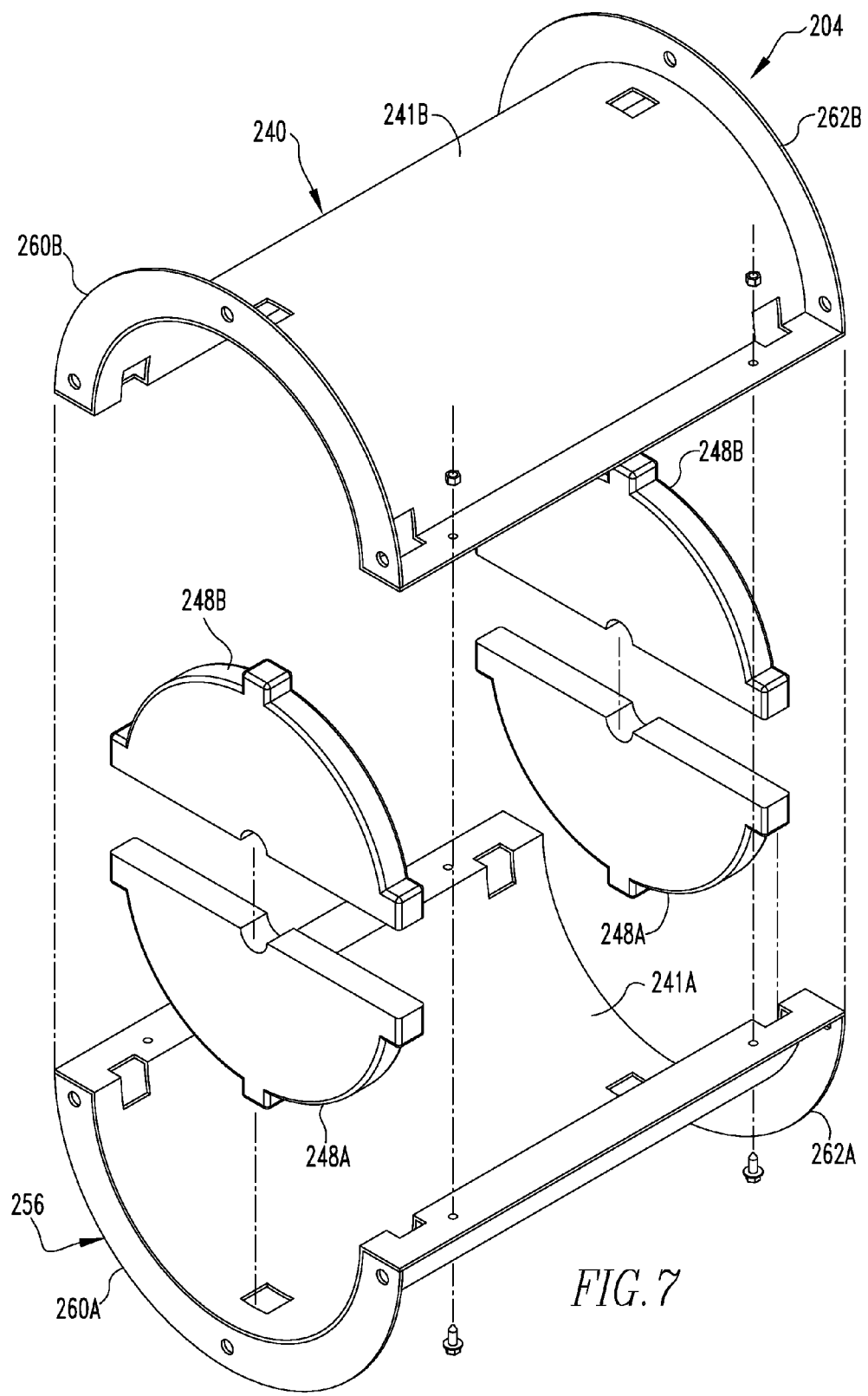
FIG. 7 is an exploded perspective view of another improved conduit in accordance with a third embodiment of the disclosed and claimed concept that is usable as part of another improved conduit apparatus.

An improved conduit apparatus 204 in accordance with the disclosed and claimed concept is depicted generally in FIG. 7 and includes one or more conduits 240 (only one of which is depicted in FIG. 7 for purposes of simplicity of disclosure. For instance, three of the conduits 240 can be employed together to form the conduit apparatus 204, as appropriate. The conduits 240 each include a pair of conduit portions 241A and 241B that are cooperable with the pair of blocks 248A and 248B in a fashion similar to the conduit apparatus 104. However, the conduit portion 241A has a pair of attachment flanges 260A and 262A attached at the opposite ends thereof, and the conduit portion 241B has a pair of attachment flanges 260B and 262B attached at its opposite ends. The attachment flange portions 260A and 260B are attachable to the sidewall 20A, and the attachment flange portions 262A and 262B are attachable to the sidewall 20B. Installation of the conduit apparatus 204 can be substantially the same as the installation of the conduit apparatus 104, albeit the conduit portions 241A and 241B are individually connected with the sidewalls 20A and 20B.

It thus can be seen that the improved conduit apparatuses 4, 104, and 204 are usable to carry a set of electrical conductors 8 between a pair of locations on a metal-clad electrical enclosure and thus serve as a barrier between the electrical conductors and a region of a different voltage. The conduit apparatuses for 4, 104, and 204 are configured to avoid electrical flash-over from the electrical conductors by providing pairs of blocks 48A and 48B, 148A and 148B, and 248A and 248B that are formed of an insulative high dielectric material, and by configuring the conduits 40, 140, and 240 to be of sufficient diameter to avoid a field concentration at the ends thereof. For instance, the conduits 40 may each be on the order of ten inches in diameter. The conduit apparatuses 4, 104, and 204 advantageously do not inhibit the flowing therepast of heated air generated within the enclosure under normal operating conditions and/or exhaust gases from an arc event. Rather, the conduit apparatuses 4, 104, and 204 cool such gases prior to the gases being exhausted through the plenum 38. Other advantages will be apparent.

Figure 8:
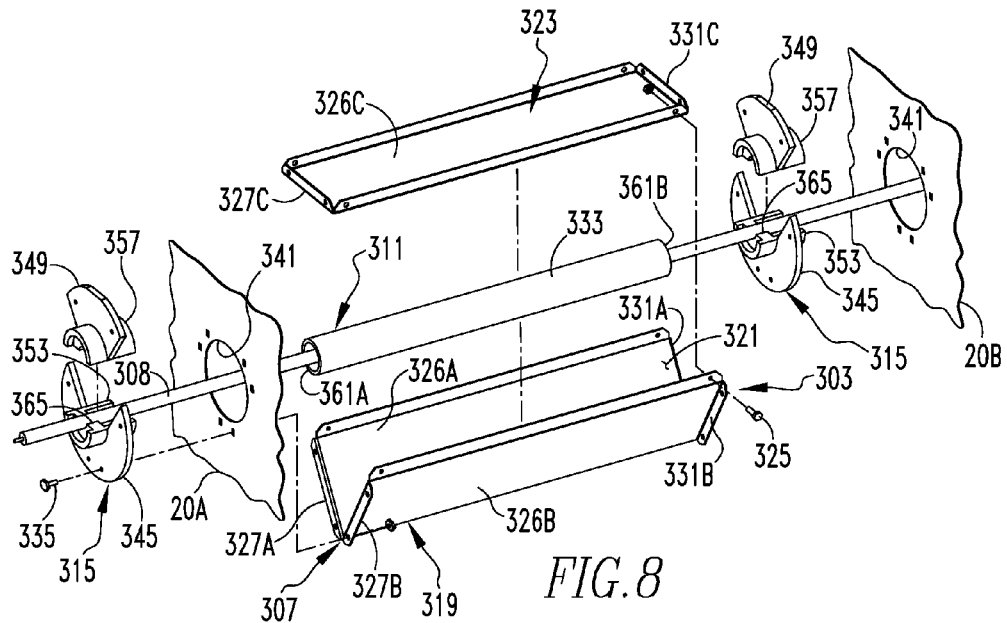
FIG. 8 is an exploded perspective view of an improved conduit assembly in accordance with a fourth embodiment of the disclosed and claimed concept.
Figure 9:
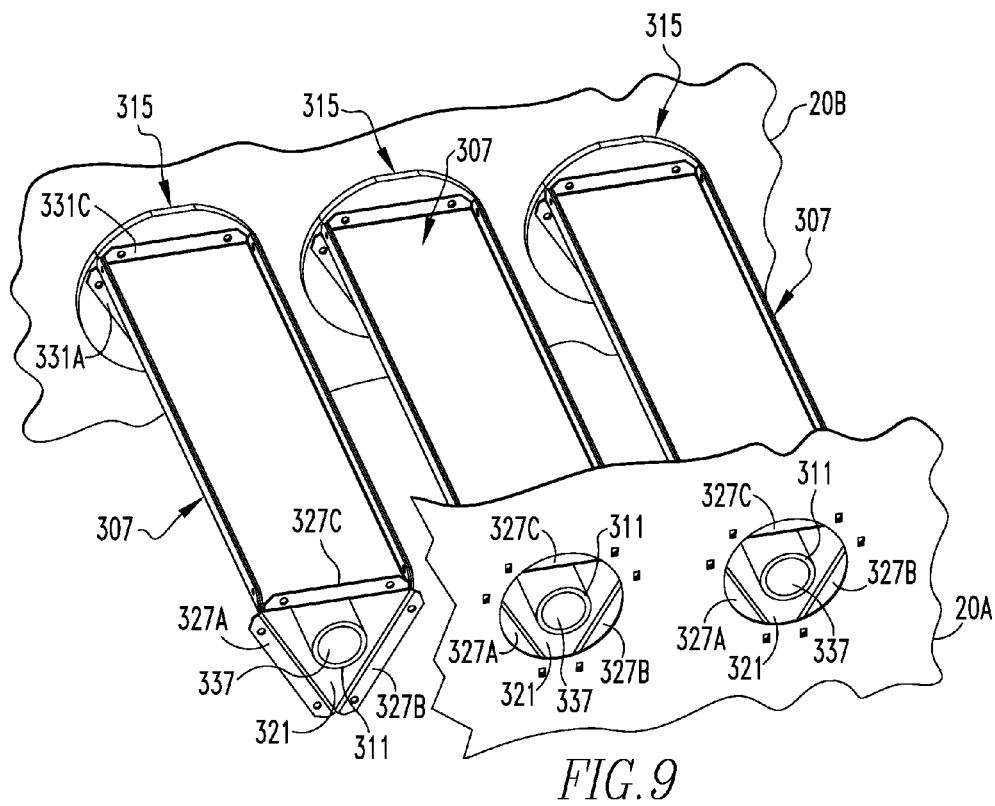
FIG. 9 is a perspective view of a fractional plurality of the conduit assemblies of FIG. 8 in the process of being assembled between the sidewalls of an electrical enclosure.
Figure 11:
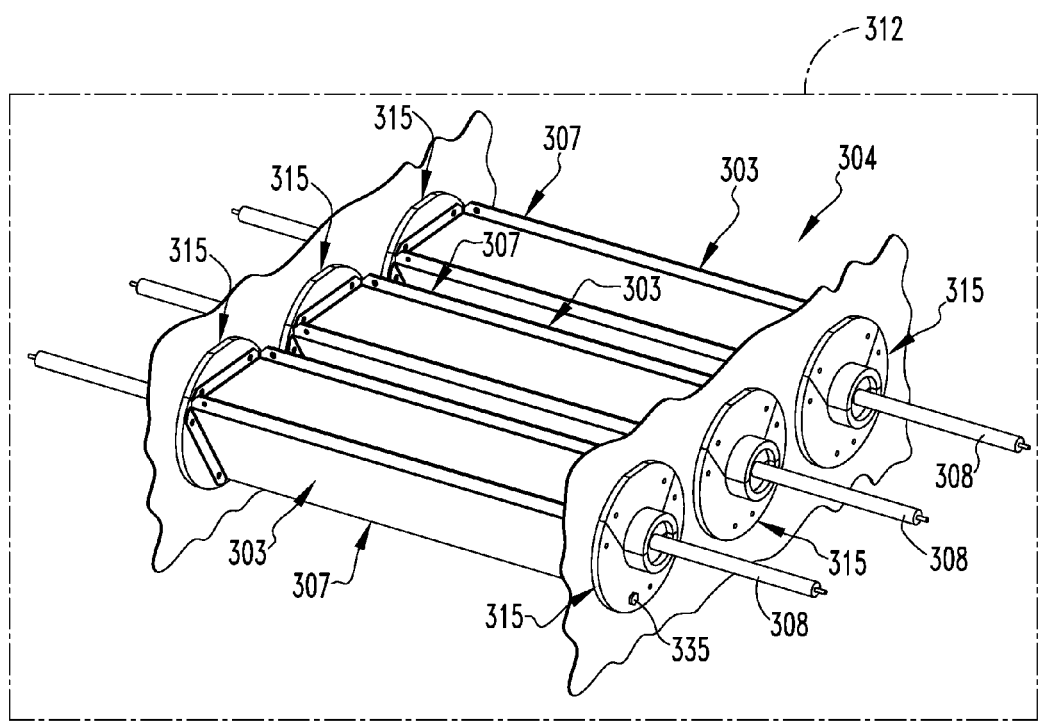
FIG. 11 is a perspective view of an improved conduit apparatus in accordance with the disclosed and claimed concept mounted to the sidewalls to form an improved electrical enclosure apparatus that is likewise in accordance with the disclosed and claimed concept.

An improved conduit assembly 303 in accordance with a fourth embodiment of the disclosed and claimed concept is depicted in an exploded fashion in FIG. 8. The conduit assembly 303 is mountable to the sidewalls 20A and 20B in a fashion similar to the conduit apparatus 4. In the depicted exemplary embodiment, three of the conduit assemblies 303 mounted to the sidewalls 20A and 20B form an improved conduit apparatus 304 in accordance with the disclosed and claimed concept that is depicted in FIG. 11. FIG. 11 can also be said to depict an improved electrical enclosure apparatus 312 in accordance with the disclosed and claimed concept which is similar to the electrical enclosure apparatus 12 except that it includes the conduit apparatus 304 in place of the conduit apparatus 4.

As can be understood from FIG. 8, the conduit assembly 3 can be said to include an outer conduit 307, an inner conduit 311, and a pair of flange assemblies 315. The outer conduit 307 in the depicted exemplary embodiment is of a hollow and approximately triangular cross section and includes a trough 319 and a cover 323 that are connectable together with a number of fasteners 325, one of which is depicted in FIG. 8. The trough 319 and the cover 323 are formed from a metallic conductive material, such as steel or other sheet metal. The inner conduit 311 is formed of an insulative material such as filament wound glass tubing, and extruded ceramic material such as porcelain or other ceramic, an epoxy glass material that is formed from glass particles or short fibers held together with an epoxy binder, or other such insulative material.

The trough 319 includes a pair of walls 326A and 326B that are connected together or that are otherwise co-formed as a single piece unit. The wall 326A terminates at a pair of tabs 327A and 331A, and the wall 326B terminates at a pair of tabs 327B and 331B. The cover 323 likewise includes a wall 326C that terminates at a pair of tabs 327C and 331C. The tabs 327A, 327B, 327C, 331A, 331B, and 331C are mountable to the side walls 20A and 20B.

More specifically, FIGS. 8-11 depict the side wall 20A having one of the flange assemblies 315 mounted to a first surface of the side wall 20A and situated adjacent an opening 341 and with the tabs 327A, 327B, and 327C affixed to an opposite surface of the side wall 20A opposite that to which the flange assembly 315 is affixed. A plurality of fasteners 335 extend through holes formed in the flange assembly 315, and in the side wall 20A, and in the tabs 327A, 327B, and 327C. By directly affixing the outer conduit 307 to the aforementioned surface of the sidewall 20A, the outer conduit 307 is electrically connected and thus grounded to the side wall 20A and likewise to the balance of the electrical enclosure apparatus 12, which is desirable.

At the opposite end, the other flange assembly 315 is affixed to a surface of the side wall 20B, and the tabs 331A, 331B, and 331C are engaged with the flange assembly 315 such that the flange assembly 315 is interposed between the tabs 331A, 331B, and 331C and the side wall 20B. Additional fasteners 335 are employed to affix the tabs 331A, 331B, and 331C and flange assembly 315 to the side wall 20B. In such a situation the tabs 331A, 331B, and 331C are not electrically connected with the side wall 20B. However, since the tabs 327A, 327B, and 327C are electrically connected with the sidewall 20A, the outer conduit 307 is grounded to the other portions of the electrical enclosure apparatus 312.

The outer conduit 307 can be said to have an interior region 321 that is situated adjacent the walls 326A, 326B, and 326C, and within which the inner conduit 311 is situated. The inner conduit 311 has its own wall 333 and its own interior regions 337 that is structured to carry a wire 308 therein. The insulative material of the wall 333 of the inner conduit 311 provides dielectric resistance between the wire 308 and the outer conduit 307, which is desirable. Moreover, by retaining the wire 308 at approximately the center of the interior region 321, the inner conduit 311 provides as additional dielectric resistance the air space between the wall 333 of the inner conduit 311 and the walls 326A, 326B, and 326C of the outer conduit 307. Moreover, since the inner conduit 311 retains the wire 308 at a position situated generally centrally within the interior region 321, the flange assemblies 315 need not provide as much compressive force to retain the wire 308 in a state of tension within the conduit assembly 303 as in the other embodiments set forth above.

More specifically, it can be seen that each flange assembly 315 includes a bottom portion 345 and a top portion 349. The bottom portion 345 includes a bottom support portion 353 that helps to support the inner conduit 311 within the interior region 321, and the top portion 349 likewise includes a top support portion 357 that similarly helps to retain the inner conduit 311 within the interior region 321. In the depicted exemplary embodiment, the inner conduit 311 includes a pair of opposite ends 361A and 361B that are engaged against stops formed on the top and bottom support portions 353 and 357 that resist movement of the inner conduit 311. The top and bottom support portions 357 and 353, with the ends 361A and 361B of the inner conduit 311 received therein, serve as long and tortuous paths that resist the passage of an electrical arc between the wire 308 and, for instance, the outer conduit 307. That is, the bottom and top support portions 353 and 357 serve as seats that snugly receive the ends 361A and 361B of the inner conduit 311 therein with minimal spacing between the outer surface of the wall 333 and the opposed inner surfaces of the support portions 353 and 357, which resists an electrical arc from passing between the wire 308 and the outer conduit 307.

The flange assemblies 315 can be said to include a hole 365 between the bottom and top 345 and 349 and which receives the wire 308 therein. The wire 308 is received between the bottom and top portions 345 and 349 and in the hole 365 with at least a nominal interference fit, but for the reasons set forth above, the interference fit need be only tight enough to provide a nominal level of compression against the wire 308 since the wire 308 is supported within the interior region 321 by being received in the interior region 337 of the inner conduit 311.

Figure 10:
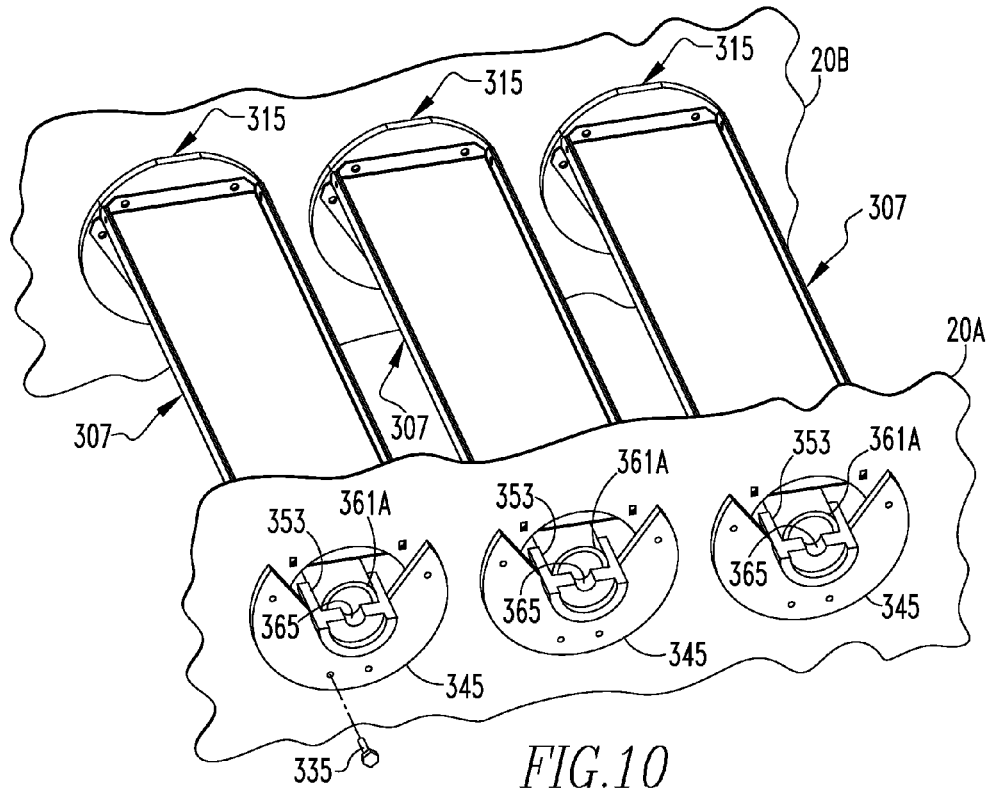
FIG. 10 is a view similar to FIG. 9, except depicting a further state of assembly.

As can be understood from FIG. 10, the tabs 327A and 327B are mechanically connected with the bottom portion 345, and the tabs 331A and 331B are likewise connected with the other bottom portion 345. The tab 327C is connected with the top portion 349, and the tab 331C is connected with the other top portion 349. Such identity between the portions of the outer conduit 307 and the portions of the flange assembly 315 provide secure attachment of the conduit assembly 303 to the side walls 20A and 20B.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A conduit apparatus structured to carry therein a number of electrical conductors between a first location and a second location, the conduit apparatus comprising:
   a number of first conduits, each first conduit of the number of first conduits being elongated and having a number of first walls and a first interior region situated adjacent the number of first walls;
   a number of second conduits, each second conduit of the number of second conduits being elongated and having a second wall and a second interior region situated adjacent the second wall, the second interior region being structured to carry therein an electrical conductor of the number of electrical conductors;
   an attachment apparatus that is structured to mechanically connect the number of first conduits with at least a first electrical enclosure through which at least a portion of the number of electrical conductors extend; and
   a number of supports, each support of the number of supports carrying thereon a corresponding second conduit of the number of second conduits and retaining the corresponding second conduit in a position situated within the first interior region of a corresponding first conduit of the number of first conduits, each support of the number of supports being mounted to at least one of the at least first electrical enclosure and the corresponding first conduit.

2. The conduit apparatus of claim 1 wherein each support of the number of supports retains the corresponding second conduit in a position spaced from the number of first walls of the corresponding first conduit.

3. The conduit apparatus of claim 1 wherein the number of first walls comprise a plurality of first walls that are connected with one another in an approximately triangular shape.

4. The conduit apparatus of claim 3 wherein a pair of first walls of the plurality of first walls are affixed together to form a trough, and wherein a third first wall of the plurality of first walls is connectable with the trough to form a first conduit of the number of first conduits.

5. The conduit apparatus of claim 4 wherein the trough is approximately of a V-shape whose point is oriented in the vertically downward direction.

6. The conduit apparatus of claim 1 wherein the attachment apparatus comprises a number of tabs that are situated at the ends of at least some of the first walls of the number of first walls of each first conduit of the number of first conduits, the number of tabs each being connectable with at least one of the at least first electrical enclosure and a support of the number of supports to mount the corresponding first conduit to the at least first electrical enclosure.

7. The conduit apparatus of claim 1 wherein each support of the number of supports includes a flange assembly that comprises a first portion and a second portion that together cover the first interior region at an end of a corresponding first conduit of the number of first conduits and that are structured to overlie an opening formed in the at least first electrical enclosure.

8. The conduit apparatus of claim 7 wherein the first portion includes a first support portion that is engaged with the second conduit at an end thereof and wherein the second portion includes a second support portion that is engaged with the second conduit at the end thereof.

9. The conduit apparatus of claim 8 wherein first and second support portions together form a seat that receives therein the end of the second conduit.

10. The conduit apparatus of claim 7 wherein at least one of the first portion and the second portion has formed therein a hole that is structured to make an interference with an electrical conductor of the number of electrical conductors.

11. An electrical enclosure comprising the conduit apparatus of claim 1, and further comprising:
   a number of electrical conductors, each electrical conductor of the number of electrical conductors extending through the second interior region of a corresponding second conduit of the number of second conduits;
   a plurality of walls comprising a first wall and a second wall that each have a number of openings formed therein, each electrical conductor of the number of electrical conductors extending through a corresponding opening of the number of openings that is formed in the first wall and extending through another corresponding opening of the number of openings that is formed in the second wall; and
   the number of first conduits being affixed to and being electrically connected with at least one of the first wall and the second wall by mechanically connecting at least a portion of the attachment apparatus with at least one of the first wall and the second wall.

* * * * *